United States Patent
Matsunaga et al.

(10) Patent No.: US 12,331,386 B2
(45) Date of Patent: Jun. 17, 2025

(54) PURE COPPER PLATE

(71) Applicant: MITSUBISHI MATERIALS CORPORATION, Tokyo (JP)

(72) Inventors: Hirotaka Matsunaga, Aizuwakamatsu (JP); Yuki Ito, Ageo (JP); Hiroyuki Mori, Tsukuba (JP); Norihisa Iida, Sakai (JP); Motohiro Hitaka, Sakai (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 411 days.

(21) Appl. No.: 17/909,707

(22) PCT Filed: Mar. 8, 2021

(86) PCT No.: PCT/JP2021/008945
§ 371 (c)(1),
(2) Date: Sep. 6, 2022

(87) PCT Pub. No.: WO2021/177469
PCT Pub. Date: Sep. 10, 2021

(65) Prior Publication Data
US 2023/0112081 A1    Apr. 13, 2023

(30) Foreign Application Priority Data
Mar. 6, 2020    (JP) .................. 2020-038770

(51) Int. Cl.
C22F 1/08    (2006.01)
C22C 9/00    (2006.01)
(52) U.S. Cl.
CPC . C22F 1/08 (2013.01); C22C 9/00 (2013.01)

(58) Field of Classification Search
CPC ..... C22F 1/08; C22F 1/00; C22C 9/00; H01L 23/3735; H01L 23/3736; H05K 2201/0355; H05K 1/09
See application file for complete search history.

(56) References Cited

U.S. PATENT DOCUMENTS 6,197,433 B1 * 3/2001 Hatano .................... C22C 9/00
420/500
2011/0163447 A1    7/2011 Fukushima et al.
(Continued)

FOREIGN PATENT DOCUMENTS

CN    102108457 A    6/2011
CN    102165080 A    8/2011
(Continued)

OTHER PUBLICATIONS

Chinese Office Action mailed Apr. 13, 2023 for the corresponding Chinese Patent Application No. 202180018747.8 (16 pages including English translation).
(Continued)

*Primary Examiner* — John A Hevey
(74) *Attorney, Agent, or Firm* — Leason Ellis LLP; Melvin C. Garner; Mitsuhiro Haraguchi (57) ABSTRACT

A pure copper sheet of the present invention has a composition including 99.96 mass % or more of Cu, 0.01 mass ppm or more and 3.00 mass ppm or less of P, 3.0 mass ppm or more of a total content of Ag and Fe, and inevitable impurities as a balance, in which an average crystal grain size of crystal grains on a rolled surface is 10 μm or more, and, in a case where a measurement area of 1 mm² or more is measured by an EBSD method at measurement intervals of 5 μm steps, a measurement point where a CI value analyzed with data analysis software OIM is 0.1 or less is excluded, and a boundary where an orientation angle
(Continued)

between adjacent pixels is 5° or more is regarded as a crystal grain boundary, a Kernel average misorientation (KAM) value is 1.50 or less.

5 Claims, 1 Drawing Sheet

(56) References Cited

U.S. PATENT DOCUMENTS

| | | | |
|---|---|---|---|
| 2018/0237901 A1 | 8/2018 | Mori et al. | |
| 2023/0090953 A1* | 3/2023 | Matsunaga | H05K 1/09 428/457 |
| 2024/0124954 A1* | 4/2024 | Matsunaga | C22C 9/00 |

FOREIGN PATENT DOCUMENTS

| | | | |
|---|---|---|---|
| CN | 110284025 A | 9/2019 | |
| CN | 110462074 A | 11/2019 | |
| EP | 4067517 A1 | 10/2022 | |
| JP | 62282797 A | 12/1987 | |
| JP | 06002058 A | 1/1994 | |
| JP | 2000212660 A | 8/2000 | |
| JP | 2016020516 A | 2/2016 | |
| JP | 2016125093 A | 7/2016 | |
| JP | 2017071832 A | 4/2017 | |
| JP | 2017179490 A | 10/2017 | |
| JP | 2018024930 A | 2/2018 | |
| JP | 2019183256 A | 10/2019 | |
| TW | 201139706 A | 11/2011 | |
| TW | 201139707 A | 11/2011 | |
| WO | 2010038642 A1 | 4/2010 | |

OTHER PUBLICATIONS

Notice of Allowance mailed Sep. 20, 2023 for the corresponding Chinese Patent Application No. 202180018747.8 (8 pages including English translation).

International Search Report mailed May 25, 2021 for the corresponding PCT International Patent Application No. PCT/JP2021/008945 ( 5 pages including English translation ).

Japanese Office Action mailed May 23, 2023 for the corresponding Japanese Patent Application No. 2021-540094 (4 pages).

Taiwanese Office Action mailed Jul. 31, 2024 for the corresponding Taiwanese Patent Application No. TW 110108125 (7 pages including English translation).

European Office Action mailed Feb. 27, 2024 for the corresponding European Patent Application No. 21764331.1 (10 pages).

* cited by examiner

PURE COPPER PLATE

CROSS-REFERENCE TO RELATED PATENT APPLICATIONS

This application is a U.S. National Phase Application under 35 U.S.C. § 371 of International Patent Application No. PCT/JP2021/008945 filed on Mar. 8, 2021 and claims the benefit of priority to Japanese Patent Applications No. 2020-038770 filed on Mar. 6, 2020, the contents of all of which are incorporated herein by reference in their entireties. The International Application was published in Japanese on Sep. 10, 2021 as International Publication No. WO/2021/177469 under PCT Article 21(2).

FIELD OF THE INVENTION

The present invention relates to a pure copper sheet suitable for electrical and electronic components such as heat sinks or thick copper circuits, in particular, a pure copper sheet in which coarsening of crystal grains during heating is suppressed.

BACKGROUND OF THE INVENTION

Conventionally, highly conductive copper or copper alloy has been used for electrical and electronic components such as heat sinks or thick copper circuits.

Recently, in response to an increase in the current in electronic devices, electric devices, or the like, attempts have been made to increase the sizes and thicknesses of electrical and electronic components that are used in these electronic devices, electric devices, or the like in order for a decrease in the current density and the diffusion of heat attributed to Joule heat generation.

Here, in semiconductor devices, for example, an insulated circuit substrate or the like in which a copper material is joined to a ceramic substrate to form the above-described heat sink or thick copper circuit is used.

At the time of joining the ceramic substrate and a copper sheet, the joining temperature is often set to 800° C. or higher, and there is a concern that the crystal grains of the copper material that forms the heat sink or the thick copper circuit may become coarse during joining. Particularly, in copper materials made of pure copper that is particularly excellent in terms of the conductivity and the heat radiation, there is a tendency that crystal grains are likely to become coarse.

In a case where the crystal grains become coarse in the heat sink or the thick copper circuit after joining, there is a concern that a problem may be caused in terms of the appearance due to the coarsening of the crystal grains.

Here, for example, Japanese Unexamined Patent Application, First Publication No. H06-002058 proposes a pure copper sheet in which the growth of crystal grains is suppressed. Japanese Unexamined Patent Application, First Publication No. H06-002058 describes that, when 0.0006 to 0.0015 wt % of S is contained, it is possible to adjust the crystal grains to a certain size even when a heat treatment is performed at a recrystallization temperature or higher.

CITATION LIST

Patent Document

[Patent Document 1]
Japanese Unexamined Patent Application, First Publication No. H06-002058

Technical Problem

Incidentally, at the time of firmly joining a ceramic substrate and a copper sheet, a heat treatment is performed at a high temperature in a state where the ceramic substrate and the copper sheet are pressurized at a relatively high pressure (for example, 0.1 MPa or more) in the stacking direction. At this time, in the pure copper sheet, the crystal grains are likely to grow nonuniformly, and the coarsening or nonuniform growth of the crystal grains may cause poor joining, poor appearance, or defects in the inspection step. In order to solve this problem, in pure copper sheets, there is a demand that a change in the crystal grain sizes is small and the sizes are uniform even after a pressure heat treatment for joining with a material of a different kind.

Here, in Japanese Unexamined Patent Application, First Publication No. H06-002058, the coarsening of the crystal grains is suppressed by specifying the content of S; however, there is a case where it is not possible to obtain an effect of sufficiently suppressing the coarsening of the crystal grains after a pressure heat treatment only by specifying the content. In addition, there is a case where, after the pressure heat treatment, the crystal grains locally become coarse and the crystal structure becomes nonuniform.

Furthermore, in the case of increasing the content of S in order to suppress the coarsening of the crystal grains, there is a problem in that the hot workability significantly deteriorates and the manufacturing yield of pure copper sheets significantly deteriorates.

The present invention has been made in view of the above-described circumstances, and an objective of the present invention is to provide a pure copper sheet that is excellent in terms of hot workability and is capable of suppressing crystal grains becoming coarse and nonuniform even after a pressure heat treatment.

SUMMARY OF THE INVENTION

Solution to Problem

The present inventors performed intensive studies in order to solve this problem and consequently obtained the following finding. Among impurity elements contained in a small amount in a pure copper sheet, there is an element having a crystal grain growth-suppressing effect of suppressing the coarsening of crystal grains by being present at crystal grain boundaries. Therefore, it was found that it is possible to suppress the crystal grains becoming coarse or nonuniform even after a pressure heat treatment by utilizing this element having the crystal grain growth-suppressing effect (hereinafter, referred to as the crystal grain growth-suppressing element). In addition, it was found that, in order to make the action of this crystal grain growth-suppressing element sufficiently exhibited, it is effective to regulate the content of a specific element.

Furthermore, it was found that it is effective to make the grain sizes of crystal grains relatively large and suppress the strain energy accumulated in materials at a low level in order to suppress the driving force for crystal grain growth during a pressure heat treatment.

The present invention has been made based on the above-described findings, and a pure copper sheet having a composition of the present invention includes 99.96 mass % or more of Cu, 0.01 mass ppm or more and 3.00 mass ppm or less of P, 3.0 mass ppm or more of a total content of Ag and Fe, and inevitable impurities as a balance, in which an average crystal grain size of crystal grains on a rolled surface is 10 μm or more, and, a Kernel average misorientation (KAM) value is 1.50 or less when a measurement area of 1 mm² or more is measured by an EBSD method at measurement intervals of 5 μm steps, a measurement point where a CI value analyzed with data analysis software OIM is 0.1 or less is excluded, and a boundary where an orientation angle between adjacent pixels is 5° or more is regarded as a crystal grain boundary.

According to the pure copper sheet having this configuration, since the pure copper sheet has a composition in which the content of Cu is set to 99.96 mass % or more, the content of P is set to 0.01 mass ppm or more and 3.00 mass ppm or less, the total content of Ag and Fe is set to 3.0 mass ppm or more, and the balance is inevitable impurities, it becomes possible to suppress the coarsening of crystal grains by the formation of solid solutions of Ag and Fe in the matrix of copper.

In addition, since the content of P is set to 3.00 mass ppm or less, it is possible to suppress the deterioration of hot workability.

In addition, since the average crystal grain size of the crystal grains on the rolled surface is set to 10 μm or more, the grain sizes are relatively large in a state before a pressure heat treatment, the driving force for recrystallization during the pressure heat treatment is small, and it becomes possible to suppress grain growth.

In addition, since the above-described KAM value is set to 1.50 or less, the dislocation density is relatively low, and the accumulated strain energy is small, and thus the driving force for recrystallization during a pressure heat treatment is small, and it becomes possible to suppress grain growth.

Here, in the pure copper sheet of the present invention, it is preferable that a content of S is set in a range of 2.0 mass ppm or more and 20.0 mass ppm or less.

In this case, 2.0 mass ppm or more of S, which is a crystal grain growth-suppressing element, is contained, whereby it becomes possible to reliably suppress the crystal grains becoming coarse or nonuniform even after the heat treatment. In addition, when the content of S is limited to 20.0 mass ppm or less, it is possible to sufficiently ensure hot workability.

In addition, in the pure copper sheet of the present invention, it is preferable that a total content of Mg, Sr, Ba, Ti, Zr, Hf, and Y is 10.0 mass ppm or less.

There is a concern that elements such as Mg, Sr, Ba, Ti, Zr, Hf, and Y that may be contained as inevitable impurities may generate a compound with the crystal grain coarsening-suppressing element that suppresses the coarsening of the crystal grains by being segregated in the crystal grain boundaries (S, Se, Te, or the like) and may impair the action of the crystal grain growth-suppressing elements. Therefore, when the total content of Mg, Sr, Ba, Ti, Zr, Hf, and Y is limited to 10.0 mass ppm or less, it is possible to make the crystal grain growth-suppressing effect of the crystal grain growth-suppressing elements sufficiently exhibited, and it becomes possible to reliably suppress the crystal grains becoming coarse or nonuniform even after the heat treatment.

Furthermore, in the pure copper sheet of the present invention, it is preferable that a ratio $d_{max}/d_{ave}$ of a maximum crystal grain size $d_{max}$ to an average crystal grain size $d_{ave}$ in a range of 50 mm×50 mm is 20.0 or less after a pressure heat treatment is performed under conditions of a pressure of 0.6 MPa, a heating temperature of 850° C., and a retention time at the heating temperature of 90 minutes.

In this case, even in a case where the pressure heat treatment has been performed on the pure copper sheet under the above-described conditions, it is possible to reliably suppress the crystal grains becoming nonuniform, and it is possible to further suppress the occurrence of poor appearance.

Furthermore, in the pure copper sheet of the present invention, it is preferable that Vickers hardness is 150 HV or less.

In this case, since the Vickers hardness is 150 HV or less, the pure copper sheet is sufficiently soft, and characteristics as a pure copper sheet are ensured, the pure copper sheet is particularly suitable as a material for electrical and electronic components for high-current uses.

Advantageous Effects of Invention

According to the present invention, it is possible to provide a pure copper sheet that is excellent in terms of hot workability and is capable of suppressing crystal grains becoming coarse and nonuniform even after a pressure heat treatment.

DETAILED DESCRIPTION OF THE INVENTION

Figure 1:
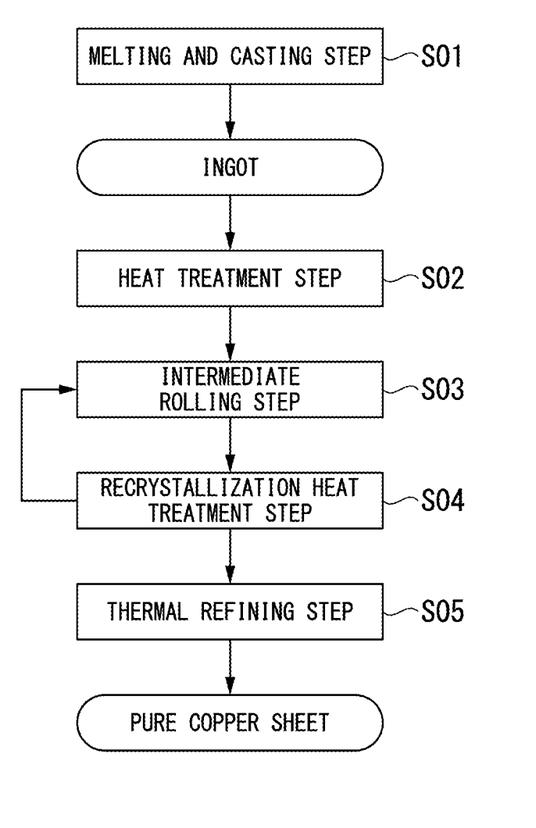
The FIGURE is a flowchart of a method for manufacturing a pure copper sheet according to the present embodiment.

Hereinafter, a pure copper sheet according to an embodiment of the present invention will be described.

A pure copper sheet, which is the present embodiment, is used as a material for electrical and electronic components such as heat sinks or thick copper circuits and is used in a state of being joined to, for example, a ceramic substrate at the time of molding the above-described electrical and electronic components.

The pure copper sheet, which is the present embodiment, has a composition in which the Cu content is set to 99.96 mass % or more, the content of P is set to 0.01 mass ppm or more and 3.00 mass ppm or less, the total content of Ag and Fe is set to 3.0 mass ppm or more, and the balance is inevitable impurities. Hereinafter, there are cases where "mass %" and "mass ppm" are each expressed as "%" and "ppm".

It should be noted that, in the pure copper sheet, which is the present embodiment, it is preferable that the content of S is set in a range of 2.0 mass ppm or more and 20.0 mass ppm or less.

In addition, in the pure copper sheet, which is the present embodiment, it is preferable that the total content of one or more selected from Mg, Sr, Ba, Ti, Zr, Hf, and Y (A element group) is 10.0 mass ppm or less.

In addition, in the pure copper sheet, which is the present embodiment, the average crystal grain size of crystal grains on a rolled surface is set to 10 μm or more. The average crystal grain size of the crystal grains on the rolled surface can be obtained as the average value of the cut lengths by, for example, in accordance with the cutting method of JIS H 0501, drawing 5 vertical line segments having a predetermined length and 5 horizontal line segments having a predetermined length on the rolled surface and counting the number of crystal grains that are fully cut.

In addition, in the pure copper sheet of the present embodiment, in a case where a measurement area of 1 mm² or more is measured by an EBSD method at measurement intervals of 5 μm steps, a measurement point where the CI value analyzed with data analysis software OIM is 0.1 or less is excluded, and a boundary where an orientation angle between adjacent pixels is 5° or more is regarded as a crystal grain boundary, a Kernel average misorientation (KAM) value is set to 1.50 or less.

In the pure copper sheet, which is the present embodiment, it is preferable that a ratio $d_{max}/d_{ave}$ of a maximum crystal grain size $d_{max}$ to an average crystal grain size $d_{ave}$ within a range of 50 mm×50 mm is 20 or less after a pressure heat treatment is performed under conditions of a pressure of 0.6 MPa, a heating temperature of 850° C., and a retention time at the heating temperature of 90 minutes. The maximum crystal grain size $d_{max}$ can be obtained as, for example, the average value of the major axis of the crystal grain that is the coarsest crystal grain in a selected arbitrary range with an area of 50 mm×50 mm and the minor axis that is cut by grain boundaries when lines are drawn perpendicular to the major axis. In addition, in the pure copper sheet, which is the present embodiment, it is preferable that the Vickers hardness is 150 HV or less.

Here, the reasons for specifying the component composition, the KAM value, and a variety of characteristics as described above in the pure copper sheet of the present embodiment will be described below.

(Purity of Cu: 99.96 mass % or higher)

In electrical and electronic components for high-current uses, there is a demand for excellent conductivity and an excellent heat radiation in order to suppress the generation of heat during electrical conduction, and pure copper that is particularly excellent in terms of the conductivity and the heat radiation is preferably used. In addition, in the case of being joined to a ceramic substrate or the like, it is preferable that the pure copper sheet has a small deformation resistance such that thermal strain generated during loading of thermal cycle can be relaxed.

Therefore, in the pure copper sheet, which is the present embodiment, the purity of Cu is specified as 99.96 mass % or higher.

It should be noted that the purity of Cu is preferably 99.965 mass % or higher and more preferably 99.97 mass % or higher. In addition, the upper limit of the purity of Cu is not particularly limited, but is preferably set to 99.999 mass % or lower since, in a case where the upper limit exceeds 99.999 mass %, a special refining step is required, and the manufacturing cost significantly increases.

(P: 0.01 mass ppm or more and 3.00 mass ppm or less)

P is widely used as an element that detoxifies oxygen in copper. However, in a case where P is contained in a certain amount or more, P impairs the action of not only oxygen but also the crystal grain growth-suppressing element present in crystal grain boundaries. Therefore, at the time of heating the pure copper sheet to a high temperature, there is a concern that the crystal grain growth-suppressing element may not sufficiently act and crystal grains may become coarse and nonuniform. In addition, the hot workability also deteriorates.

Therefore, in the present invention, the content of P is limited to 0.01 mass ppm or more and 3.00 mass ppm or less.

It should be noted that the upper limit of the content of P is preferably set to 2.50 mass ppm or less and more preferably set to 2.00 mass ppm or less. On the other hand, the lower limit of the content of P is preferably set to 0.02 mass ppm or more and more preferably set to 0.03 mass ppm or more.

(Total content of Ag and Fe: 3.0 mass ppm or more)

Ag and Fe are elements having an action of suppressing the coarsening of the crystal grains by forming solid solutions in the copper matrix.

Therefore, in a case where the total content of Ag and Fe is set to 3.0 mass ppm or more in the present embodiment, it is possible to make the crystal grain coarsening-suppressing effect of Ag and Fe sufficiently exhibited, and it becomes possible to reliably suppress the crystal grains becoming coarse even after the pressure heat treatment.

It should be noted that the lower limit of the total content of Ag and Fe is preferably 5.0 mass ppm or more, more preferably 7.0 mass ppm or more, and still more preferably 10.0 mass ppm or more. On the other hand, the upper limit of the total content of Ag and Fe is not particularly limited, but is preferably set to less than 100.0 mass ppm, more preferably set to less than 50.0 mass ppm, and still more preferably less than 20.0 mass ppm since the addition of the elements more than necessary causes an increase in the manufacturing cost and a decrease in the electrical conductivity.

(Content of S: 2.0 mass ppm or more and 20.0 mass ppm or less)

S is an element that has an action of suppressing the coarsening of crystal grains by suppressing the movement of crystal grain boundaries and degrades hot workability.

Therefore, in a case where the content of S is set to 2.0 mass ppm or more in the present embodiment, it is possible for the crystal grain coarsening-suppressing effect of S to be sufficiently exhibited, and it becomes possible to reliably suppress crystal grains becoming coarse even after the pressure heat treatment. On the other hand, in a case where the content of S is limited to 20.0 mass ppm or less, it becomes possible to ensure hot workability.

It should be noted that the lower limit of the content of S is preferably 2.5 mass ppm or more and more preferably 3.0 mass ppm or more. In addition, the upper limit of the content of S is preferably 17.5 mass ppm or less and more preferably 15.0 mass ppm or less.

(Total content of Mg, Sr, Ba, Ti, Zr, Hf, and Y (A element group): 10.0 mass ppm or less)

There is a concern that Mg, Sr, Ba, Ti, Zr, Hf, and Y (A element group) that are contained as inevitable impurities may generate a compound with the crystal grain coarsening-suppressing element that suppresses the coarsening of the crystal grains by being segregated in the crystal grain boundaries (S, Se, Te, or the like) and may impair the action of the crystal grain coarsening-suppressing elements.

Therefore, in order to reliably suppress the coarsening of crystal grains after the heat treatment, the total content of Mg, Sr, Ba, Ti, Zr, Hf, and Y (A element group) is preferably set to 10.0 mass ppm or less.

It should be noted that the total content of Mg, Sr, Ba, Ti, Zr, Hf, and Y (A element group) is preferably 7.5 mass ppm or less and more preferably 5.0 mass ppm or less.

(Other Elements)

It should be noted that Al, Cr, Sn, Be, Cd, Mg, Ni, and Pb (M element group) have an effect of suppressing grain growth by the formation of solid solutions in the copper matrix, segregation in the grain boundaries, and, furthermore, the formation of oxides.

Therefore, in order to reliably suppress the coarsening of the crystal grains after the heat treatment, more than 2.0 mass ppm of Al, Cr, Sn, Be, Cd, Mg, Ni, and Pb (M element group) in total are preferably contained. It should be noted that, in the case of intentionally containing Al, Cr, Sn, Be, Cd, Mg, Ni, and Pb (M element group), the lower limit of the total content of Al, Cr, Sn, Be, Cd, Mg, Ni, and Pb (M element group) is more preferably set to 2.1 mass ppm or more, still more preferably set to 2.3 mass ppm or more, far still more preferably set to 2.5 mass ppm or more, and optimally set to 3.0 mass ppm or more.

On the other hand, when Al, Cr, Sn, Be, Cd, Mg, Ni, and Pb (M element group) are contained more than necessary, since there is a concern that the electrical conductivity may decrease, the upper limit of the total content of Al, Cr, Sn, Be, Cd, Mg, Ni, and Pb (M element group) is preferably set to less than 100.0 mass ppm, more preferably set to less than 50.0 mass ppm, far more preferably less than 20.0 mass ppm, and still far more preferably set to less than 10.0 mass ppm.

(Other Inevitable Impurities)

As other inevitable impurities other than the above-described elements, B, Bi, Ca, Sc, rare earth elements, V, Nb, Ta, Mo, W, Mn, Re, Ru, Os, Co, Rh, Ir, Pd, Pt, Au, Zn, Hg, Ga, In, Ge, As, Sb, Tl, N, C, Si, Li, H, O, and the like are exemplary examples. It is preferable to reduce these inevitable impurities since there is a concern that the inevitable impurities may decrease the electrical conductivity.

(Average crystal grain size of crystal grains on rolled surface: 10 μm or more) In the pure copper sheet, which is the present embodiment, when the average crystal grain size of the crystal grains on the rolled surface is fine, at the time of heating this pure copper sheet, recrystallization is likely to proceed, and there is a concern that the growth of the crystal grains and the structure becoming nonuniform may be accelerated.

Therefore, in order to further suppress the coarsening of the crystal grains during the pressure heat treatment, the average crystal grain size of the crystal grains on the rolled surface is preferably set to 10 μm or more.

It should be noted that the average crystal grain size of the crystal grains on the rolled surface is preferably 15 μm or more and more preferably 20 μm or more.

(KAM value: 1.50 or less)

The Kernel average misorientation (KAM) value that is measured by EBSD is a value calculated by averaging the orientation angles between one pixel and pixels surrounding the one pixel. Since the shape of the pixel is a regular hexagon, in a case where the proximity order is set to 1 (1st), the average value of the orientation angles with six adjacent pixels is calculated as the KAM value. The use of this KAM value makes it possible to visualize local orientation angles, that is, the distribution of strain. Since a region where this KAM value is high is a region where the density of dislocations introduced during working is high, recrystallization is likely to proceed, and there is a concern that the growth of the crystal grains and the structure becoming nonuniform may be accelerated. Therefore, when the KAM value is controlled to be 1.50 or less, it becomes possible to suppress the crystal grains becoming coarse and nonuniform. It should be noted that the KAM value is preferably 1.40 or less and more preferably 1.30 or less.

It should be noted that, in the present embodiment, the KAM value is obtained with the proximity order set to 1. In addition, in the present embodiment, the average value of the KAM values in structures excluding regions where the CI value, which indicates the clarity of the crystallinity of an analysis point is 0.1 or less, a worked structure has significantly developed and a clear crystal pattern cannot be obtained is obtained. The average value of the KAM values is preferably calculated using, for example, the KAM values measured at three or more places at equal distances from the center of the rolled surface.

(Ratio $d_{max}/d_{ave}$ of maximum crystal grain size $d_{max}$ to average crystal grain size $d_{ave}$ in range of 50 mm×50 mm after pressure heat treatment: 20.0 or less)

In the pure copper sheet, which is the present embodiment, in a case where the ratio $d_{max}/d_{ave}$ of the maximum crystal grain size $d_{max}$ to the average crystal grain size $d_{ave}$ within a range of 50 mm×50 mm on the rolled surface after the pressure heat treatment under the conditions of a pressure of 0.6 MPa, a heating temperature of 850° C., and a retention time at the heating temperature of 90 minutes is 20 or less, it is possible to reliably suppress the crystal grains becoming nonuniform even in a case where the pressure heat treatment has been performed, and the pure copper sheet is particularly suitable as a material for thick copper circuits or heat sinks that are joined to ceramic substrates.

It should be noted that the ratio $d_{max}/d_{ave}$ of the maximum crystal grain size $d_{max}$ to the average crystal grain size $d_{ave}$ in a range of 50 mm×50 mm after the above-described pressure heat treatment is more preferably 15.0 or less.

(Vickers hardness: 150 HV or less)

In the pure copper sheet, which is the present embodiment, when the Vickers hardness is set to 150 HV or less, characteristics as a pure copper sheet are ensured, and the pure copper sheet is particularly suitable as a material for electrical and electronic components for high-current uses. In addition, the pure copper sheet is sufficiently soft, and, even in a case where the pure copper sheet is joined to a different member such as a ceramic substrate and loaded with a thermal cycle, it becomes possible to relieve thermal strain generated by the deformation of the pure copper sheet.

It should be noted that the Vickers hardness of the pure copper sheet is more preferably 140 HV or less, still more preferably 130 HV or less, and most preferably 110 HV or less. The lower limit of the Vickers hardness of the pure copper sheet is not particularly limited; however, in a case where the hardness is too low, since the pure copper sheet is likely to deform during manufacturing and becomes hard to handle, the Vickers hardness is preferably 30 HV or more, more preferably 45 HV or more, and most preferably 60 HV or more.

Next, a method for manufacturing the pure copper sheet, which is the present embodiment configured as described above, will be described with reference to a flowchart shown in the FIGURE.

(Melting and Casting Step S01)

First, a copper raw material is melted to produce molten copper. It should be noted that, as the copper raw material, for example, 4NCu having a purity of 99.99 mass % or higher or 5NCu having a purity of 99.999 mass % or higher is preferably used.

It should be noted that, in the case of adding S, it is possible to use a S single body, a Cu—S mother alloy, or the like. It should be noted that, in the case of manufacturing a Cu—S mother alloy as well, 4NCu having a purity of 99.99 mass % or higher and 5NCu having a purity of 99.999 mass % or higher is preferably used.

In addition, in the melting step, atmosphere melting using an inert gas atmosphere in which the vapor pressure of $H_2O$ is low (for example, Ar gas) is performed in order to decrease the hydrogen concentration, and the retention time during melting is preferably kept to the minimum.

In addition, the molten copper having an adjusted component is injected into a casting mold to produce an ingot. It should be noted that, in the case of taking mass production into account, a continuous casting method or a semi-continuous casting method is preferably used.

(Heat Treatment Step S02)

The obtained ingot is cut, and the surface is ground to remove scale. After that, a heat treatment is performed for homogenization and the formation of a solution. Here, the heat treatment conditions are not particularly limited; however, preferably, in order to suppress the generation of a precipitate, it is preferable to perform the heat treatment at a heat treatment temperature in a range of 500° C. or higher and 900° C. or lower for a retention time at the heat treatment temperature in a range of 0.1 hour or longer and 100 hours or shorter in a non-oxidizing or reducing atmosphere. In addition, the cooling method is not particularly limited, but it is preferable to select a method in which the cooling rate becomes 200° C./min or faster such as water quenching.

In addition, in order to make the structure uniform, hot working may be performed after the heat treatment. The working method is not particularly limited; however, in a case where the final form is a sheet or a strip, rolling is adopted. Alternatively, forging, pressing, or groove rolling may be adopted. The temperature during the hot working is also not particularly limited, but is preferably set in a range of 500° C. or higher and 900° C. or lower. In addition, the total working rate of the hot working is preferably set to 50% or more, more preferably set to 60% or more, and still more preferably 70% or more.

(Intermediate Rolling Step S03)

Next, intermediate rolling is performed on the copper material that has been subjected to the heat treatment step S02 to work the copper material into a predetermined shape. It should be noted that the temperature condition in the intermediate rolling step S03 is not particularly limited, but the intermediate rolling step is preferably performed in a range of −200° C. or higher and 200° C. or lower. In addition, the working rate in the intermediate rolling step S03 is appropriately selected so as to work the copper material into a shape similar to the final shape, and the working rate is preferably set to 30% or more in order to improve the productivity.

(Recrystallization Heat Treatment Step S04)

Next, a heat treatment is performed on the copper material that has been subjected to the intermediate rolling step S03 for the objective of recrystallization. Here, the average crystal grain size of recrystallized grains on the rolled surface is desirably 10 μm or more. When the recrystallized grains are fine, there is a concern that, when a pressure heat treatment is performed afterwards, the growth of the crystal grains and the structure becoming nonuniform may be accelerated.

The heat treatment conditions in the recrystallization heat treatment step S04 are not particularly limited, but the copper material is preferably held at a heat treatment temperature in a range of 200° C. or higher and 900° C. or lower for a range of 1 second or longer and 10 hours or shorter. For example, in a short-time heat treatment, the copper material may be held at 850° C. for 5 seconds, and, in a long-time heat treatment of 1 hour or longer, the copper material may be held at 400° C. for 8 hours.

In addition, in order to make the recrystallization structure uniform, the intermediate rolling step S03 and the recrystallization heat treatment step S04 may be repeated twice or more.

(Temper Rolling Step S05)

Next, temper rolling may be performed on the copper material that has been subjected to the recrystallization heat treatment step S04 in order to adjust the material strength. It should be noted that, in a case where there is no need to increase the material strength, temper rolling may not be performed.

The working rate of the temper rolling is not particularly limited, but temper rolling is preferably performed at a working rate in a range of more than 0% and 50% or less in order to adjust the material strength. Furthermore, in order to further decrease the material strength and set the KAM value to 1.50 or less, the working rate is more preferable set to more than 0% and 45% or less.

In addition, if necessary, a heat treatment may be further performed after the temper rolling in order to remove residual strain. The final thickness is not particularly limited, but is preferably, for example, in a range of 0.5 mm or more and 5 mm or less.

The pure copper sheet, which is the present embodiment, is produced by each of the above-described steps.

According to the pure copper sheet, which is the present embodiment configured as described above, since the pure copper sheet has a composition in which the content of Cu is set to 99.96 mass % or more, the content of P is set to 0.01 mass ppm or more and 3.00 mass ppm or less, the total content of Ag and Fe is set to 3.0 mass ppm or more, and the balance is inevitable impurities, it becomes possible to suppress the coarsening of crystal grains by the formation of solid solutions of Ag and Fe in the matrix of copper.

In addition, when the content of P is limited to 3.00 mass ppm or less, it is possible to ensure hot workability.

In addition, since the average crystal grain size of the crystal grains on the rolled surface is set to 10 μm or more, the grain sizes are relatively large in a state before a pressure heat treatment, the driving force for recrystallization during the pressure heat treatment is small, and it becomes possible to suppress grain growth.

In addition, since the above-described KAM value is set to 1.50 or less, the dislocation density is relatively low, and the accumulated strain energy is small, the driving force for recrystallization during a pressure heat treatment is small and it becomes possible to suppress grain growth.

In addition, in the present embodiment, in a case where the content of S is set in a range of 2.0 mass ppm or more and 20.0 mass ppm or less, S, which is one kind of crystal grain growth-suppressing element, is segregated in the grain boundaries, and it becomes possible to reliably suppress the crystal grains becoming coarse and nonuniform after the pressure heat treatment. In addition, it is possible to ensure hot workability.

Furthermore, in the present embodiment, in a case where the total content of Mg, Sr, Ba, Ti, Zr, Hf, and Y (A element group) is 10.0 mass ppm or less, it is possible to suppress these elements of the A element group and S, Se, Te, and the like, which are crystal grain growth-suppressing elements, reacting with each other to generate a compound, and it becomes possible to make the action of the crystal grain growth-suppressing elements sufficiently exhibited. Therefore, it becomes possible to reliably suppress the crystal grains becoming coarse and nonuniform after the pressure heat treatment.

Furthermore, in the present embodiment, in a case where the ratio $d_{max}/d_{ave}$ of the maximum crystal grain size $d_{max}$ to the average crystal grain size $d_{ave}$ after the pressure heat treatment is set to 20.0 or less, it is possible to reliably suppress the crystal grains becoming nonuniform even after the pressure heat treatment, and it is possible to further suppress the occurrence of poor appearance.

In addition, in the present embodiment, in a case where the Vickers hardness is 150 HV or less, since the pure copper sheet is sufficiently soft, and characteristics as a pure copper sheet are ensured, the pure copper sheet is particularly suitable as a material for electrical and electronic components for high-current uses.

Furthermore, in the present embodiment, in a case where more than 2.0 mass ppm of Al, Cr, Sn, Be, Cd, Mg, Ni, and Pb (M element group) are contained, it becomes possible to more reliably suppress grain growth after the pressure heat treatment by the formation of solid solutions in the matrix, segregation in the grain boundaries, and, furthermore, the formation of oxides by the elements of the M element copper group.

Hitherto, the pure copper sheet, which is the embodiment of the present invention, has been described, but the present invention is not limited thereto and can be appropriately modified within the scope of the technical concept of the invention.

For example, in the above-described embodiment, an example of the method for manufacturing the pure copper sheet has been described, but the method for manufacturing the pure copper sheet is not limited to the manufacturing method described in the embodiment, and the pure copper sheet may be manufactured by appropriately selecting an existing manufacturing method.

EXAMPLES

Hereinafter, the results of confirmatory experiments performed to confirm the effect of the present invention will be described.

A copper raw material having a purity of 99.999 mass % or higher and a Cu-1 mass % mother alloy of a variety of elements produced using the copper raw material and a variety of elements having a purity of 99 mass % or higher were prepared.

The above-described copper raw material was charged into a high-purity graphite crucible and melted with a high frequency in an atmosphere furnace having an Ar gas atmosphere. The above-described Cu-1 mass % mother alloy of the variety of elements was injected into the obtained molten copper to prepare a predetermined component composition.

The obtained molten copper was poured into a casting mold to produce an ingot. It should be noted that the sizes of the ingot were set to a thickness of approximately 50 mm, a width of approximately 60 mm, and a length of approximately 150 to 200 mm.

The obtained ingots were heated in an Ar gas atmosphere for 1 hour under the temperature conditions shown in Tables 1 and 2 and hot-rolled to a thickness of 25 mm.

The copper materials after hot rolling were cut, and surface grinding was performed to remove oxide films on the surfaces. At this time, the thicknesses of the copper materials to be subjected to intermediate rolling were adjusted such that the final thicknesses became as shown in Tables 1 and 2 in consideration of the rolling rates of subsequent hot rolling, intermediate rolling, and temper rolling.

The copper materials having a thickness adjusted as described above were subjected to intermediate rolling under the conditions shown in Tables 1 and 2 and water cooling.

Next, on the copper materials that had been subjected to the intermediate rolling, a recrystallization heat treatment was performed under the conditions shown in Tables 1 and 2.

In addition, on the copper materials that had been subjected to the recrystallization heat treatment, temper rolling was performed under the conditions shown in Tables 1 and 2, thereby manufacturing strip materials for characteristic evaluation having a thickness shown in Tables 1 and 2 and a width of 60 mm.

In addition, evaluation was performed regarding the following items.

(Composition Analysis)

A measurement specimen was collected from the obtained ingot, S was measured by the infrared absorption method, and other elements were measured using a glow discharge mass spectrometer (GD-MS). It should be noted that the measurement was performed at two sites, the central portion of the specimen and an end portion in the width direction, and a larger content was regarded as the content of the sample. The measurement results are shown in Tables 1 and 2.

(Evaluation of Workability)

As the evaluation of the workability, the presence or absence of a cracked edge during the above-described hot rolling and intermediate rolling was observed. A specimen from which a cracked edge was not or rarely recognized visually was evaluated as "A", a specimen in which a cracked edge as small as a length of less than 1 mm was generated was evaluated as "B", and a specimen in which a cracked edge of a length of 1 mm or more was generated was evaluated as "C".

It should be noted that the length of the cracked edge is the length of the cracked edge from an end portion in the width direction to the central portion in the width direction of the rolled material.

(Vickers Hardness)

The Vickers hardness was measured at a test load of 0.98 N in accordance with the micro Vickers hardness test method specified in JIS Z 2244. It should be noted that the measurement position was the rolled surface of the test piece for characteristic evaluation. The evaluation results are shown in Tables 3 and 4.

(Electrical Conductivity)

A test piece having a width of 10 mm and a length of 60 mm was collected from the strip material for characteristic evaluation, and the electric resistance was obtained by the 4-terminal method. In addition, the dimensions of the test piece were measured using a micrometer, and the volume of the test piece was calculated. In addition, the electrical conductivity was calculated from the measured electric resistance value and the measured volume. The evaluation results are shown in Tables 3 and 4.

It should be noted that the test piece was collected such that the longitudinal direction of the test piece became parallel to the rolling direction of the strip material for characteristic evaluation.

(Average Crystal Grain Size Before Pressure Heat Treatment)

A 20 mm×20 mm sample was cut out from the obtained strip material for characteristic evaluation, and the average crystal grain size was measured with a SEM-EBSD (electron backscatter diffraction patterns) measuring instrument (Quanta FEG 450 manufactured by FEI Company, OIM Data Collection manufactured by EDAX/TSL (currently, AMETEK Inc.)).

A rolled surface was mechanically polished using waterproof abrasive paper and diamond abrasive grains, and then finish-polished using a colloidal silica solution. After that, individual measurement points (pixels) in a measurement range on the specimen surface were irradiated with electron beams using an electron scanning microscope, and, by orientation analysis by backscatter electron diffraction, a region between adjacent measurement points where the orientation angle between the measurement points became 15° or more was regarded as a large-angle grain boundary, and a region where the orientation angle was less than 15° was regarded as a small-angle grain boundary. A crystal grain boundary map was produced using the large-angle grain boundaries, according to a cutting method of JIS H 0501, 5 vertical line segments having a predetermined length and 5 horizontal line segments having a predetermined length were drawn on the crystal grain boundary map, the number of crystal grains that were fully cut was counted, and the average value of the cut lengths was described as the average crystal grain size before the heat treatment. The evaluation results are shown in Tables 3 and 4.

(Kam Value)

In the specimen used above, the orientation angle of each crystal grain was analyzed with the EBSD measuring instrument (Quanta FEG 450 manufactured by FEI Company, OIM Data Collection manufactured by EDAX/TSL (currently AMETEK Inc.)) and the analysis software (OIM Data Analysis ver 7.3.1 manufactured by EDAX/TSL (currently AMETEK Inc.)) at an electron beam accelerating voltage of 15 kV in a measurement area of 40000 $\mu m^2$ or more at measurement intervals of 5 $\mu m$ steps except for a measurement point where the CI value was 0.1 or less, a boundary where the orientation angle between adjacent pixels was 5° or more was regarded as a crystal grain boundary, the KAM values of all of the analyzed pixels were obtained, and the average value thereof was obtained. The evaluation results are shown in Tables 3 and 4.

(Average Crystal Grain Size after Pressure Heat Treatment)

A 40 mm×40 mm sample was cut out from the above-described strip material for characteristic evaluation, the above-described sample (pure copper sheet) was sandwiched by two ceramic substrates (material: $Si_3N_4$, 50 mm×50 mm×1 mm in thickness), and a heat treatment was performed in a state where a load of a pressure of 0.60 MPa was applied. As the heat treatment, each ceramic substrate was injected into a furnace at 850° C., held for 90 minutes after the fact that the material temperature reached 850° C. was confirmed with a thermocouple, and cooled in the furnace until the material temperature reached room temperature after the end of heating. After the temperature was decreased to room temperature, in order to measure the average crystal grain size on the rolled surface of the pure copper sheet, first, the rolled surface was mechanically polished using waterproof abrasive paper and diamond abrasive grains, and then finish-polished using a colloidal silica solution. After that, the rolled surface was etched, in accordance with the cutting method of JIS H 0501, 5 vertical line segments having a predetermined length and 5 horizontal line segments having a predetermined length were drawn, the number of crystal grains that were fully cut was counted, and the average value of the cut lengths was regarded as the average crystal grain size. The evaluation results are shown in Tables 3 and 4.

(Dispersion in Grain Size after Pressure Heat Treatment)

As described above, in a sample collected from a test piece on which a pressure heat treatment had been performed, when the average value of the major axis of the most coarse crystal grain in a range of 30 mm×30 mm except for twin crystals and the minor axis that was cut by grain boundaries at the time of drawing a line perpendicular to the major axis was defined as the maximum crystal grain size $d_{max}$, a case where the ratio $d_{max}/d_{ave}$ of this maximum crystal grain size to the above-described average crystal grain size $d_{ave}$ was 15.0 or less was evaluated as "A", a case where $d_{max}/d_{ave}$ was more than 15.0 and 20.0 or less was evaluated as "B", and a case where $d_{max}/d_{ave}$ exceeded 20.0 was evaluated as "C". The evaluation results are shown in Tables 3 and 4.

TABLE 1

| | | Component composition (mass ratio) | | | | | | Manufacturing steps | | | | |
| --- | --- | --- | --- | --- | --- | --- | --- | --- | --- | --- | --- | --- |
| | | | | | | A element | M element | Hot rolling | Intermediate rolling | Recrystallization heat treatment | | Temper rolling Rolling | Thickness |
| | | Cu % | S ppm | P ppm | Ag + Fe ppm | group ppm | group ppm | Temperature ° C. | Rolling rate % | Temperature ° C. | Time sec. | rate % | mm |
| Present Invention Example | 1 | 99.96 or more | 5.0 | 0.05 | 10.2 | 3.5 | 2.1 | 800 | 90 | 750 | 360 | 12 | 1.0 |
| | 2 | 99.96 or more | 6.6 | 0.22 | 3.2 | 4.8 | 2.6 | 800 | 90 | 400 | 60 | 38 | 1.0 |
| | 3 | 99.96 or more | 6.5 | 0.19 | 5.1 | 3.6 | 2.7 | 800 | 90 | 420 | 180 | 34 | 0.5 |
| | 4 | 99.96 or more | 5.0 | 0.22 | 7.7 | 3.4 | 1.6 | 800 | 90 | 450 | 10 | 32 | 1.0 |
| | 5 | 99.96 or more | 8.1 | 0.19 | 10.3 | 4.2 | 2.4 | 800 | 90 | 350 | 15 | 35 | 1.0 |
| | 6 | 99.96 or more | 4.1 | 0.20 | 13.8 | 3.6 | 2.5 | 800 | 90 | 380 | 10 | 35 | 1.0 |
| | 7 | 99.96 or more | 4.3 | 0.19 | 10.3 | 2.5 | 2.6 | 800 | 90 | 350 | 3600 | 35 | 1.0 |
| | 8 | 99.96 or more | 6.5 | 0.21 | 11.2 | 3.8 | 2.4 | 800 | 90 | 450 | 10 | 40 | 0.5 |
| | 9 | 99.96 or more | 7.4 | 0.21 | 10.3 | 3.3 | 2.5 | 800 | 90 | 500 | 5 | 45 | 0.5 |
| | 10 | 99.96 or more | 2.5 | 0.20 | 11.4 | 4.4 | 2.6 | 800 | 90 | 450 | 10 | 50 | 0.5 |

TABLE 1-continued

|  | Component composition (mass ratio) | | | | | | Manufacturing steps | | | | | Temper rolling | |
|---|---|---|---|---|---|---|---|---|---|---|---|---|---|
|  |  |  |  |  | A element | M element | Hot rolling | Intermediate rolling | Recrystallization heat treatment | | Rolling | Thickness |
|  | Cu % | S ppm | P ppm | Ag + Fe ppm | group ppm | group ppm | Temperature °C | Rolling rate % | Temperature °C | Time sec. | rate % | mm |
| 11 | 99.96 or more | 0.2 | 0.19 | 11.4 | 3.4 | 2.7 | 800 | 90 | 500 | 5 | 36 | 1.5 |
| 12 | 99.96 or more | 2.1 | 0.14 | 10.9 | 2.3 | 2.7 | 800 | 90 | 425 | 180 | 35 | 1.5 |
| 13 | 99.96 or more | 2.6 | 0.18 | 10.7 | 3.1 | 2.3 | 800 | 90 | 400 | 45 | 35 | 1.5 |
| 14 | 99.96 or more | 32.0 | 0.18 | 11.8 | 3.0 | 2.5 | 800 | 90 | 400 | 600 | 8 | 1.0 |
| 15 | 99.96 or more | 19.2 | 0.20 | 12.1 | 3.5 | 2.7 | 800 | 90 | 400 | 600 | 8 | 0.5 |
| 16 | 99.96 or more | 17.3 | 0.21 | 10.1 | 3.2 | 2.7 | 800 | 90 | 400 | 600 | 10 | 0.5 |
| 17 | 99.96 or more | 5.6 | 2.10 | 11.4 | 4.9 | 4.2 | 800 | 90 | 350 | 600 | 32 | 1.0 |
| 18 | 99.96 or more | 4.8 | 3.00 | 10.8 | 4.0 | 4.6 | 800 | 90 | 400 | 60 | 35 | 0.5 |

A element group: One or more selected from Mg, Sr, Ba, Ti, Zr, Hf, and Y
M element group: One or more selected from Al, Cr, Sn, Be, Cd, Mg, Ni, and Pb

TABLE 2

|  |  | Component composition (mass ratio) | | | | | | Manufacturing steps | | | | | Temper rolling | |
|---|---|---|---|---|---|---|---|---|---|---|---|---|---|---|
|  |  |  |  |  |  | A element | M element | Hot rolling | Intermediate rolling | Recrystallization heat treatment | | Rolling | Thickness |
|  |  | Cu % | S ppm | P ppm | Ag + Fe ppm | group ppm | group ppm | Temperature °C | Rolling rate % | Temperature °C | Time sec. | rate % | mm |
| Present Invention Example | 19 | 99.96 or more | 6.3 | 0.02 | 10.7 | 2.9 | 2.4 | 800 | 90 | 400 | 5 | 35 | 0.5 |
|  | 20 | 99.96 or more | 4.2 | 1.64 | 10.2 | 7.3 | 2.6 | 800 | 90 | 350 | 600 | 35 | 0.5 |
|  | 21 | 99.96 or more | 5.6 | 1.82 | 10.3 | 9.8 | 2.6 | 800 | 90 | 420 | 180 | 35 | 0.5 |
|  | 22 | 99.96 or more | 6.2 | 1.95 | 13.1 | 12.1 | 2.3 | 800 | 90 | 450 | 10 | 38 | 0.5 |
|  | 23 | 99.96 or more | 6.7 | 0.19 | 11.3 | 4.0 | 2.4 | 800 | 92 | 550 | 30 | 0 | 1.5 |
|  | 24 | 99.96 or more | 6.1 | 0.17 | 12.3 | 2.7 | 2.5 | 800 | 92 | 580 | 5 | 0 | 1.5 |
|  | 25 | 99.96 or more | 5.1 | 0.56 | 10.8 | 4.1 | 2.9 | 800 | 90 | 500 | 3600 | 8 | 2.0 |
|  | 26 | 99.96 or more | 5.5 | 0.68 | 11.1 | 4.0 | 3.1 | 800 | 90 | 525 | 30 | 8 | 1.5 |
|  | 27 | 99.96 or more | 5.1 | 1.60 | 12.7 | 5.2 | 4.2 | 800 | 88 | 460 | 30 | 10 | 1.0 |
|  | 28 | 99.96 or more | 6.4 | 1.80 | 11.2 | 4.8 | 4.3 | 800 | 88 | 450 | 60 | 12 | 2.0 |
| Comparative Example | 1 | 99.96 or more | 6.7 | 160 | 9.7 | 4.3 | 163.5 | 800 | 90 | 350 | 15 | 50 | 0.5 |
|  | 2 | 99.96 or more | 4.4 | 1.50 | 0.2 | 4.6 | 0.1 | 800 | 95 | 330 | 600 | 52 | 0.5 |
|  | 3 | 99.96 or more | 5.8 | 0.14 | 10.6 | 3.6 | 2.5 | 800 | 90 | 380 | 5 | 62 | 0.5 |

A element group: One or more selected from Mg, Sr, Ba, Ti, Zr, Hf, and Y
M element group: One or more selected from Al, Cr, Sn, Be, Cd, Mg, Ni, and Pb

TABLE 3

|  |  | Workability | Vickers hardness HV | Electrical conductivity % IACS | KAM | Before pressure heat treatment Average crystal grain size μm | After pressure heat treatment Average crystal grain size μm | Dispersion in grain size |
|---|---|---|---|---|---|---|---|---|
| Present Invention Example | 1 | A | 76 | 100 | 1.12 | 42 | 283 | A |
|  | 2 | A | 101 | 98 | 1.32 | 20 | 462 | A |
|  | 3 | A | 84 | 98 | 1.29 | 21 | 443 | A |
|  | 4 | A | 85 | 99 | 1.29 | 20 | 401 | A |
|  | 5 | A | 95 | 99 | 1.28 | 11 | 479 | B |
|  | 6 | A | 96 | 99 | 1.29 | 14 | 452 | A |
|  | 7 | A | 94 | 98 | 1.28 | 19 | 432 | A |
|  | 8 | A | 102 | 98 | 1.32 | 21 | 433 | A |
|  | 9 | A | 113 | 98 | 1.42 | 22 | 452 | A |
|  | 10 | A | 126 | 98 | 1.48 | 20 | 480 | A |
|  | 11 | A | 94 | 98 | 1.29 | 22 | 432 | A |
|  | 12 | A | 95 | 98 | 1.28 | 23 | 410 | A |
|  | 13 | A | 95 | 98 | 1.28 | 23 | 398 | A |
|  | 14 | B | 69 | 100 | 1.04 | 42 | 186 | A |
|  | 15 | B | 72 | 101 | 1.06 | 38 | 203 | A |
|  | 16 | B | 81 | 100 | 1.04 | 39 | 227 | A |
|  | 17 | A | 98 | 99 | 1.26 | 29 | 357 | A |
|  | 18 | A | 93 | 98 | 1.25 | 26 | 392 | A |

TABLE 4

|  |  | Workability | Vickers hardness HV | Electrical conductivity % IACS | KAM | Before pressure heat treatment Average crystal grain size μm | After pressure heat treatment Average crystal grain size μm | Dispersion in grain size |
|---|---|---|---|---|---|---|---|---|
| Present Invention Example | 19 | A | 101 | 98 | 1.28 | 25 | 346 | A |
|  | 20 | A | 102 | 98 | 1.26 | 20 | 425 | A |
|  | 21 | A | 103 | 98 | 1.27 | 20 | 440 | A |
|  | 22 | A | 103 | 98 | 1.29 | 22 | 468 | A |
|  | 23 | A | 54 | 102 | 0.95 | 53 | 76 | A |
|  | 24 | A | 56 | 102 | 0.97 | 56 | 69 | A |
|  | 25 | A | 63 | 101 | 1.02 | 54 | 106 | A |
|  | 26 | A | 69 | 101 | 1.04 | 48 | 138 | A |
|  | 27 | A | 74 | 100 | 1.05 | 39 | 204 | A |
|  | 28 | A | 76 | 100 | 1.12 | 35 | 261 | A |
| Comparative Example | 1 | C | 130 | 98 | 1.45 | 14 | 527 | C |
|  | 2 | A | 131 | 98 | 1.47 | 13 | 511 | C |
|  | 3 | A | 139 | 97 | 2.12 | 16 | 634 | C |

In Comparative Example 1, the content of P was 160 mass ppm, which was larger than the range of the present invention, and the workability deteriorated. In addition, after the pressure heat treatment, the average crystal grain size became as coarse as 500 μm or more, and the dispersion in the grain size became large.

In Comparative Example 2, since the total content of Ag and Fe was 0.2 mass ppm, which was smaller than the range of the present invention, the crystal grains became coarse after the pressure heat treatment, and the dispersion in the grain size became large.

In Comparative Example 3, since the working rate of temper rolling was 62%, which was higher than the preferable range of the present invention, the KAM value was 2.12, which was larger than the range of the present invention, the crystal grains became coarse after the pressure heat treatment, and the dispersion in the grain size also became large.

In contrast, in Present Invention Examples 1 to 28, the average crystal grain sizes after the heat treatment were small, and the dispersions in the grain size also were small.

From the above-described results, it was confirmed that, according to the present invention examples, it is possible to provide a pure copper sheet that is excellent in terms of hot workability and is capable of suppressing crystal grains becoming coarse and nonuniform even after a pressure heat treatment.

What is claimed is:

1. A pure copper sheet having a composition comprising:
    99.96 mass % or more of Cu;
    0.01 mass ppm or more and 3.00 mass ppm or less of P;

3.0 mass ppm or more of a total content of Ag and Fe; and inevitable impurities as a balance, wherein
an average crystal grain size of crystal grains on a rolled surface is 10 μm or more,
a Kernel average misorientation (KAM) value is 1.50 or less when a measurement area of 1 mm$^2$ or more is measured by an EBSD method at measurement intervals of 5 μm steps, a measurement point where a CI value analyzed with data analysis software OIM is 0.1 or less is excluded, and a boundary where an orientation angle between adjacent pixels is 5° or more is regarded as a crystal grain boundary, and
a thickness of the pure copper sheet is in a range of 0.5 mm or more and 5 mm or less.

2. The pure copper sheet according to claim 1, wherein a content of S is in a range of 2.0 mass ppm or more and 20.0 mass ppm or less.

3. The pure copper sheet according to claim 1, wherein a total content of Mg, Sr, Ba, Ti, Zr, Hf, and Y is 10.0 mass ppm or less.

4. The pure copper sheet according to claim 1, wherein a ratio $d_{max}/d_{ave}$ of a maximum crystal grain size $d_{max}$ to an average crystal grain size $d_{ave}$ in a range of 50 mm×50 mm is 20.0 or less after a pressure heat treatment is performed under conditions of a pressure of 0.6 MPa, a heating temperature of 850° C., and a retention time at the heating temperature of 90 minutes.

5. The pure copper sheet according to claim 1, wherein a Vickers hardness is 150 HV or less.

* * * * *